United States Patent [19]
Rivola et al.

[11] Patent Number: 5,331,286
[45] Date of Patent: Jul. 19, 1994

[54] METHOD FOR CONTINUOUSLY MONITORING THE SOUNDNESS OF THE PROTECTIVE COVERING ON UNDERGROUND METAL STRUCTURES, AND DEVICES FOR ITS IMPLEMENTATION

[75] Inventors: Luigi Rivola, San Donato Milanese; Sebastiano Di Liberto, San Giuliano Milanese, both of Italy

[73] Assignee: Eniricerche S.p.A., Milan, Italy

[21] Appl. No.: 65,520

[22] Filed: May 20, 1993

Related U.S. Application Data

[63] Continuation of Ser. No. 960,200, Oct. 9, 1992, abandoned, which is a continuation of Ser. No. 557,968, Jul. 25, 1990, abandoned.

[30] Foreign Application Priority Data

Aug. 1, 1989 [IT] Italy ................ 21407 A/89

[51] Int. Cl.⁵ .................... G01R 27/02; G01N 27/00
[52] U.S. Cl. .................... 324/718; 324/71.1
[58] Field of Search ............ 324/551, 425, 71.1-71.2, 324/700, 716, 718; 204/147, 196, 197, 404, 153.11

[56] References Cited

U.S. PATENT DOCUMENTS

| | | | |
|---|---|---|---|
| 3,859,116 | 1/1975 | Townsend | 437/290 |
| 4,181,882 | 1/1980 | Isaacs et al. | 324/71.1 |
| 4,255,242 | 3/1981 | Freeman | 204/147 |
| 4,280,124 | 7/1981 | Wuertele | 340/650 |
| 4,591,792 | 5/1986 | Birchmeier et al. | 324/71.1 X |
| 4,658,365 | 4/1987 | Syrett et al. | 204/147 X |
| 4,755,267 | 7/1988 | Saunders | 204/147 |
| 4,940,944 | 7/1990 | Steele et al. | 324/425 |

FOREIGN PATENT DOCUMENTS

| | | |
|---|---|---|
| 2361547 | 6/1975 | Fed. Rep. of Germany . |
| 2545325 | 4/1977 | Fed. Rep. of Germany . |
| 8808462 | 11/1988 | PCT Int'l Appl. . |
| 2132226 | 7/1984 | United Kingdom . |

OTHER PUBLICATIONS

Kasahara et al, An Improved Method for Measuring Pipe-to-Soil Potential and Current Density at Cathodically Protected Pipelines, *Materials Performance* vol. 18 No. 3 (Mar. 1973), pp. 21-25.

Rickert et al, Elektrochemische Untersuchungen zum kathodischen Korrosionsschutz mit Unterbrecherpotentiostaten, *Werkstoppe & Korrosion* Nov. 11 (1987) pp. 691-695.

*Primary Examiner*—Maura K. Regan
*Attorney, Agent, or Firm*—Rogers & Wells

[57] ABSTRACT

A method for monitoring the soundness of the protective covering on underground metal structures subjected to cathodic protection, based on the electrical resistance offered by said covering, and consisting of modulating the imposed cathodic protection current and measuring the corresponding variation in potential due to the ohmic drop, said resistance being obtained from the ratio of the variation in potential to the modulation current.

6 Claims, 5 Drawing Sheets

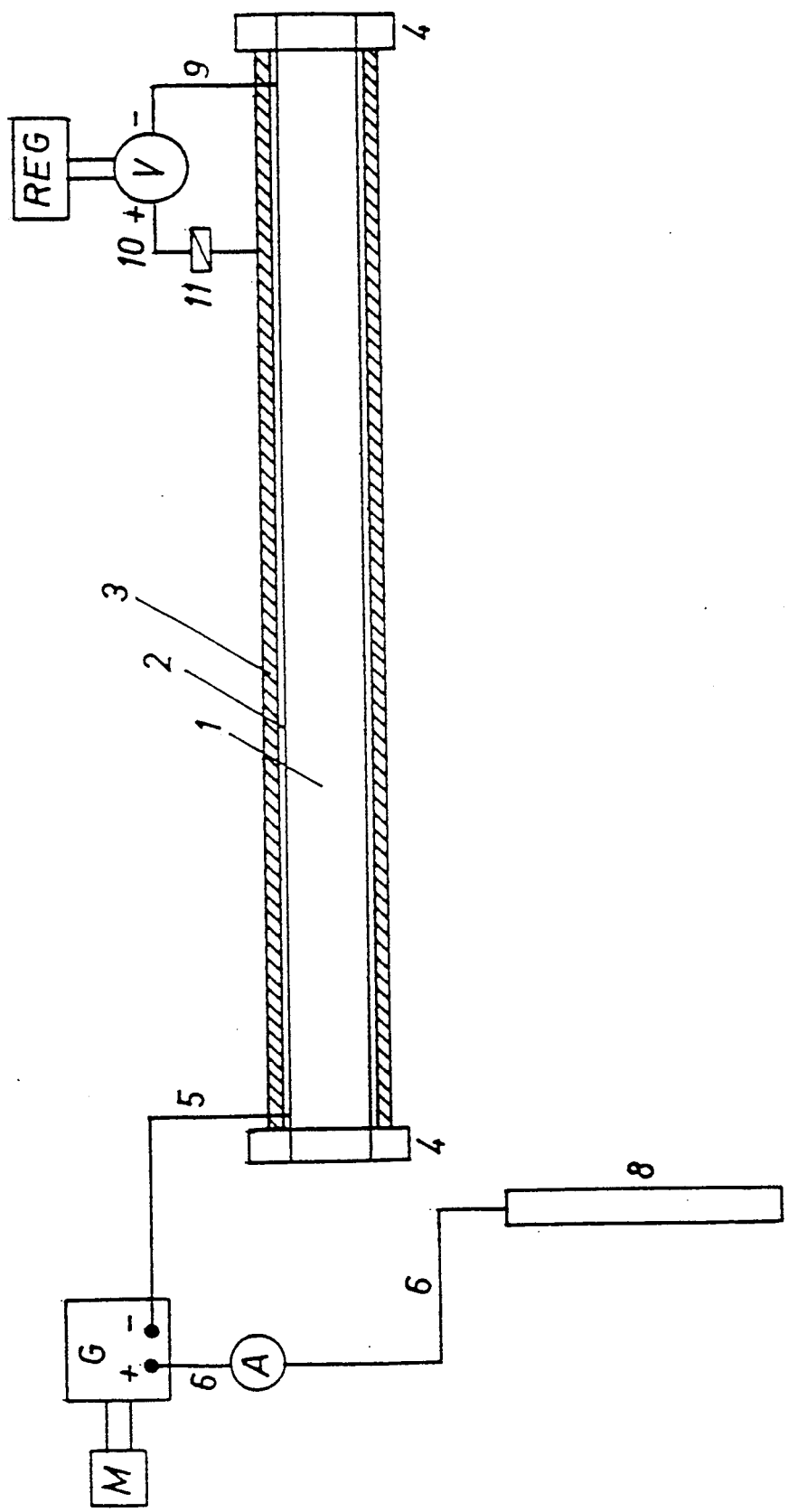

ME THOD FOR CONTINUOUSLY MONITORING THE SOUNDNESS OF THE PROTECTIVE COVERING ON UNDERGROUND METAL STRUCTURES, AND DEVICES FOR ITS IMPLEMENTATION
================================================================================================================================================

This is a continuation of application Ser. No. 07/960,200, filed Oct. 9, 1992, now abandoned, which is, in turn a continuation of application Ser. No. 07/557,968, filed Jul. 25, 1990, now abandoned.

FIELD OF THE INVENTION
----------------------

This invention relates to the protection of underground or immersed metal structures exposed to wet corrosion. In industrial practice many metal structures suffer from this technical problem, such as underground fuel storage tanks, offshore structures, fluid transporting pipelines such as water, gas or oil pipelines, or other infrastructures of industrial, civil or military use.

The present invention is described with reference to underground pipelines, which represent one of its most difficult and interesting applications but to which specific application it is in no way limited.

BACKGROUND OF THE INVENTION
---------------------------

Pipelines for transporting liquid or gaseous fluids, such as gas, water or oil pipelines, are generally constructed from lengths of metal pipe, generally of steel construction, which are welded together to form an assembled continuous pipeline which is laid in its final seat, generally consisting of a sufficiently deep trench, and then covered so that the pre-existing environment is restored and its subsequent utilization unhindered.

The assembled continuous pipeline is provided with protection against wet corrosion in that the environment in which the underground or immersed pipeline is located is very corrosive towards ferrous materials.

It is very important that the pipeline remains sound and well preserved for the entire duration of its technical life, not only because of its high construction cost but also, and in particular, because leakages of fluid must be prevented not only because of its economic value but also because it can be the cause of danger, pollution or serious disturbance. The protection generally adopted is in the form of two different types of protection which cooperate with each other, namely "passive" protection consisting of a covering which isolates the pipeline from the surrounding environment and "cathodic" protection by which it is given an electrical potential which inhibits the progress of possible electrochemical reactions which could attack the pipe metal until perforated.

The "passive" protection is generally formed by applying a continuous covering to the properly cleaned pipeline. This covering is of two main categories, the first of which comprises coatings of hydrocarbon materials such as asphalts, bitumens and greases generally applied hot in the form of a number of coats, with fibrous material reinforcements. The second category comprises coverings of synthetic polymer materials such as polyethylene, polyvinylchloride and epoxide polymers which are applied in the form of tapes wrapped spirally about the pipeline with their edges superimposed, or alternatively are applied by die-casting. Widely used protection and reinforcement materials include fibreglass tape, felt and cardboard, asbestos or other non-decaying fibrous material.

By itself, such protection is insufficient to permanently preserve a pipeline laid underground or immersed in water.

In this respect, the following facts must be considered:

no material is free of a certain porosity and permeability, even if perfectly applied, resulting in a certain though very slight passage of the chemical species responsible for the corrosive attack through the protective layer;

the sequence of operations involved in the preparation, covering, lifting, laying and burying of the pipeline can from the very beginning give rise to slight damage or imperfection in the applied covering, such defects then leading to future triggering of corrosion phenomena;

the hydrocarbon and polymer materials and their reinforcements have a very high but not absolute chemical and physical stability, especially where temperature or humidity variations occur;

natural phenomena such as earthquakes, landslips or alluvions, and accidental events can cause damage to the pipeline passive protection.

The "cathodic" protection provides protection for the pipeline at points in which porosity, damage or imperfect application of the covering have left the metal surface exposed to corrosive attack. A typical cathodic protection scheme is illustrated in FIG. 1. The pipeline 1 comprises the metal pipe 2 and its covering 3. It is segmented into discrete portions by isolating joints 4 which separate them electrically without interrupting continuity. The length of each portion is indicatively some kilometers, but this value can vary within very wide limits depending on the importance of the installation and its environment.

Of each pipeline portion, the metal part 2 to be protected is connected by the connector 5 to the negative pole of a direct current generator G, the positive pole of which is earthed through the connector 6, which is provided with a switch 7 and ammeter A, and then through a disperser electrode 8.

Said disperser electrode is generally constructed as one or more large-dimension cylindrical graphite elements and is positioned at a considerable depth and spacing so as to ensure that the electrical field which is established is correctly distributed along the entire pipeline portion. By virtue of the current fed to the pipeline, this latter assumes a negative potential with respect to its surrounding environment.

This electrical potential is measured by the voltmeter V which is connected by the connector 9 to the metal pipe 2 and by the connector 10 to a reference electrode 11 positioned in proximity to the outer part of the covering 3. It is apparent that the quantity of electric current required of the generator G to maintain the metal pipe 2 at a certain potential relative to the environment surrounding the pipeline is inversely proportional to the insulation provided by the covering 3 and directly proportional to the extent which the defects in, or the permeability of, said covering allow the electrochemical contact which generates corrosion.

The cathodic protection potentials are of the order of magnitude of one volt, and with efficient coverings the current required to maintain such potential difference relative to earth are not large. Direct measurement of the insulation from the ratio of the potential difference established in the pipeline with respect to a reference electrode to the imposed current is only significant in those cases in which the deterioration of the covering has reached such proportions that it cannot be remedied.

In this respect it should be noted that an exposed area of the order of one mm² per m² of covering is already significant from the corrosion aspect, but this would result in a change in potential (for equal imposed current) which would be practically unnoted by the measurement.

Many methods have been proposed in the known art for determining the insulation offered by the covering 3, but most of them can only be usefully used in the laboratory or, at the most, on site before laying the pipeline in the trench, and are therefore more suitable for preventive inspection by sampling than for effective field verification of an operating pipeline.

The only method for this verification which is currently of wide application is based on the measurement of the variation in the potential difference when the current fed by the generator G to the metal pipe is interrupted. This is illustrated in FIG. 1. The cathodic protection circuit shown in FIG. 1 is in operation and the generator G is feeding the current $I_{reg}$ required for the pipe 2 to assume the scheduled negative potential $\Delta V_{reg}$ necessary for its cathodic protection.

At time t, the switch 7 is opened to interrupt current passage, as indicated in diagram (A) of the FIG. 2. When the measurement has been made, the current feed $I_{reg}$ is then restored in accordance with the dashed line.

Because of the feed interruption, the potential difference decays rapidly from the value $\Delta V_{reg}$. The first part of the potential drop $\Delta V_{ohm}$ is substantially simultaneous with the interruption in the current and corresponds to the "ohmic" potential drop due to the resistance offered by the covering 3. The second part $\Delta V_{real}$ of the potential drop is slower, with asymptotic progress downwards, and is due to the reactive component of the circuit. The voltmeter V of FIG. 1, provided with a recorder REG, measures the pattern shown in diagram (B) of FIG. 2 in which the potential drop is clearly divided by a point of distinct tangency variation which separates the two components of the potential difference, allowing a reliable measurement of the value of $\Delta V_{ohm}$ which is proportional to the insulation of the covering 3, with consequent indication of its soundness or lack thereof.

In reality the described method is not free of considerable problem deriving from the actual need to interrupt the protection current in order to effect the measurement.

At time t, at which the protection action ceases, instantaneous currents begin to circulate in the pipeline due to different potential points along the pipeline which arise from local electrochemical reactions. These currents give rise to a potential $\Delta V_{ec}$ the pattern of which is shown indicatively in diagram (C) of FIG. 2, the voltmeter V in reality then measuring a potential value determined by the sum of diagrams (B) and (C) of FIG. 2 and shown in FIG. 2 as diagram (D). The pattern of diagram (D) is such that it is very difficult to determine the ordinate value at the point in which the change of tangency separating the ohmic and reactive terms of the potential difference occurs.

Said instantaneous currents are the cause of large errors in determining the insulation resistance, in that although the imposed protection current is instantaneously nullified at the moment of interruption, it is precisely this interruption which generates said electrochemical currents which disturb the system to give rise to a disturbed pattern of the potential diagram of the type shown in FIG. 2 (D).

The nature and extent of these electrochemical currents are related to the heterogeneous state of the ground and to the active corrosion-producing chemical species present in it, such as different dissolved oxygen concentrations, pH variations, different global ion concentrations, different defect distributions along the pipeline, etc.

Under such conditions the potential drop consequent on zeroing the cathodic protection current does not assume a properly defined profile, and it is not possible to measure the value $\Delta V_{ohm}$ with sufficient reproducibility, as the point of tangency change cannot be properly identified even with sophisticated recording voltmeters.

To this phenomenon there is also added the fact that with the aforesaid method the current zeroing produced by real switches is often not instantaneous but progressive, even if rapid, with the result that the ohmic drop also has an inclined rather than vertical pattern, making it even more difficult to estimate with sufficient exactness the ordinate of the point of tangency change. Another important problem is the fact that during the measurement the pipe 2 is no longer cathodically protected and is exposed to corrosion. In practice, this method is used only during occasional inspection, and for long time periods when the state of the pipeline covering is not checked. In any event the method is unsuitable for continuous monitoring of the covering because the total time involved in testing would result in a considerable period during which the pipeline was not under cathodic protection. It does therefore not allow damage of accidental type to be indicated in sufficient time to take the necessary action.

The prior art has proposed, such as in U.S. Pat. No. 4,255,242, to determine the polarized potentials and the ohmic drops on cathodically, or anodically, protected materials, but disregarding the presence of protective coatings. According to such a procedure, waveforms are used which are not square, but are variously clipped sinusoidal waves. In such a case, the detection of the variations of the induced potential cannot be correlated to a value of impressed current and, moreover, it is not possible to separate the values to be attributed to the ohmic effects or the capacitive effects (or the reactive effects) which play a completely different role.

In the paper by Kasahara et al., on Materials Performance, Vol. 18, No. 3, pages 21-25 (1979), a method is disclosed for the simulated determination of the protection potential of a coated circuit, in correlation with the current pulses delivered to a sample fitted with a coating similar to that of the conduit and connected in parallel thereto, by measuring the potential induced into the sample.

Such a determination cannot be exploited to achieve any reliable information as to the condition of the coating on the conduit. Even if the sample should simulate with fidelity the state of the conduit at a certain instant of time, and give a substantially correct value of the induced potential, this data would not afford the solution of the technical problem posed herein, which is based on the "response" (in relationship with the ohmic component only of the potential included thereby) to the current modulation with a square wave, and to its trend with the lapse of time.

SUMMARY OF THE INVENTION

In contrast, to the prior art the method according to the invention enables the state of the pipeline covering to be continuously determined without the described problem of the prior art such as interruption of the cathodic protection current, inability to correlate the induced potential to the value of impressed current and to determine actual values.

BRIEF DESCRIPTION OF THE DRAWINGS

FIG. 3 is a schematic view of the device used for monitoring the soundness of a protective coating on a metal structure in accordance with the present invention.

FIG. 4 is a schematic view of a preferred embodiment of the monitoring device used in the present invention.

DETAILED DESCRIPTION OF THE INVENTION

The method according to the invention is described with reference to FIGS. 3 and 4, which show a typical embodiment thereof by way of non-limiting example.

The method according to the invention applies cathodic current to the pipeline 1 but modulates it permanently (in accordance with diagram E) of FIG. 4 in a symmetrical pattern about the desired current, preferably using square waves of low modulation level, and in any event below 10%, the preferred modulation range being between 0.5% and 5%. The modulation frequency is less than 100 Hz, the preferred range being between 0.05 and 1.0 Hz, and the ratio of the two half-periods is between 0.001 and 1000, the preferred range being between 0.1 and 10.

Figure 1:
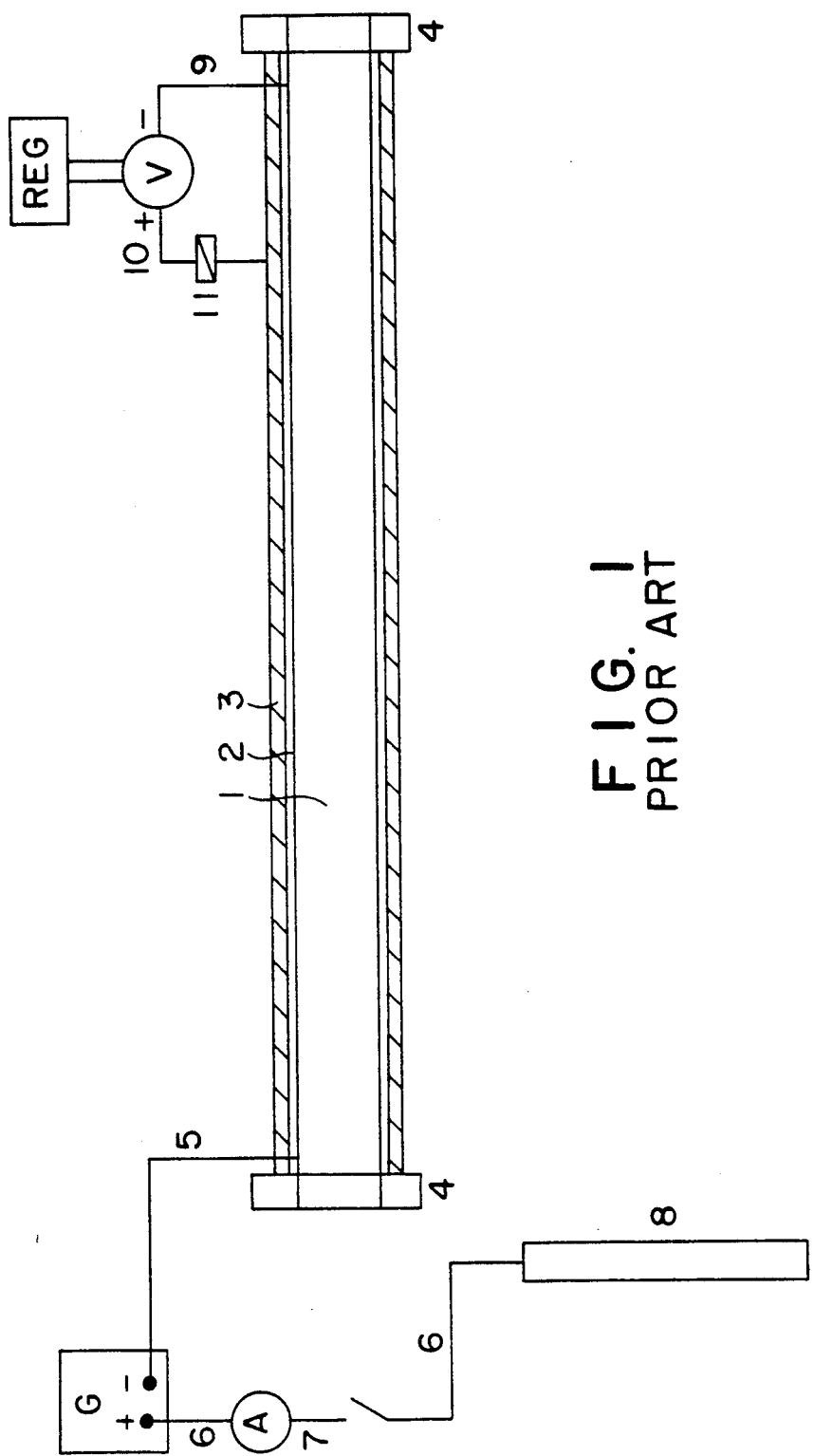
FIG. 1 is a schematic view of the prior art device used to generate cathodic protection.
Figure 2A:
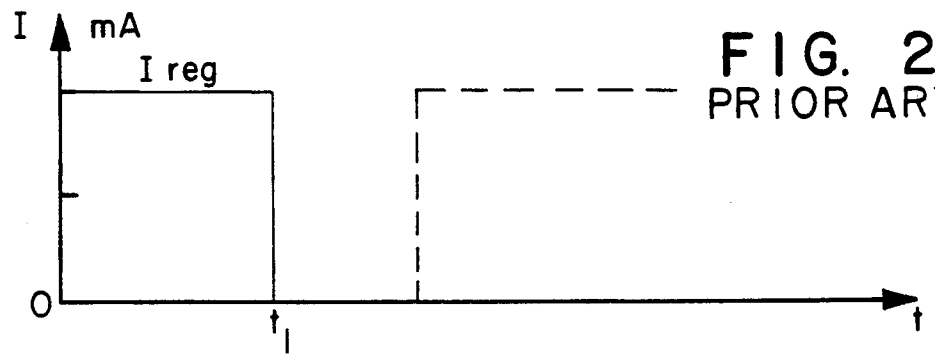
FIGS. 2A-2D is a graphical representation of current and voltage changes with respect to time for the prior art cathodic protection scheme of FIG. 1.
Figure 2B:
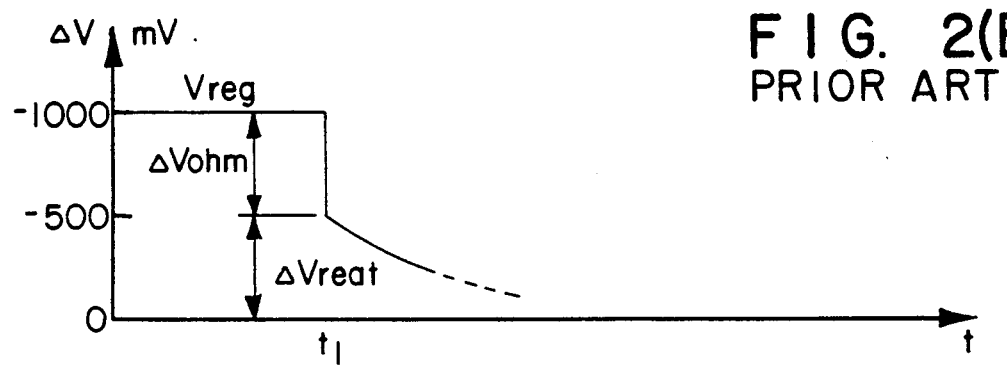
Figure 2C:
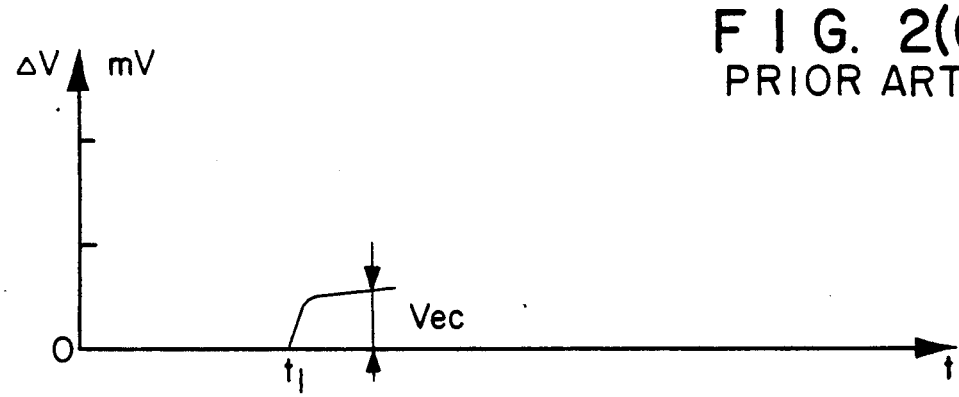
Figure 2D:
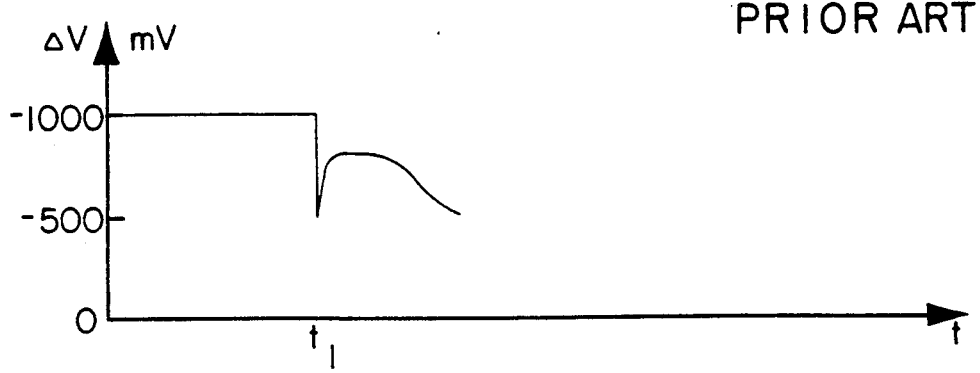
Figure 4E:
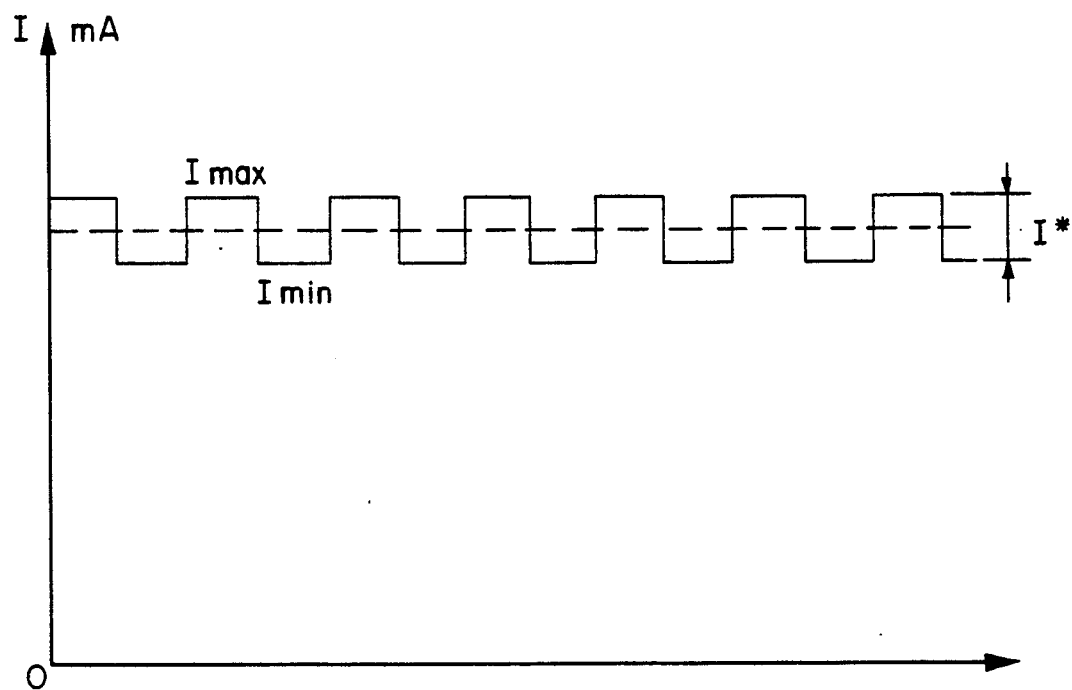
FIGS. 4E-4F is a graphical representation of current and voltage changes with respect to time in accordance with the present invention as illustrated in FIG. 3.
Figure 4F:
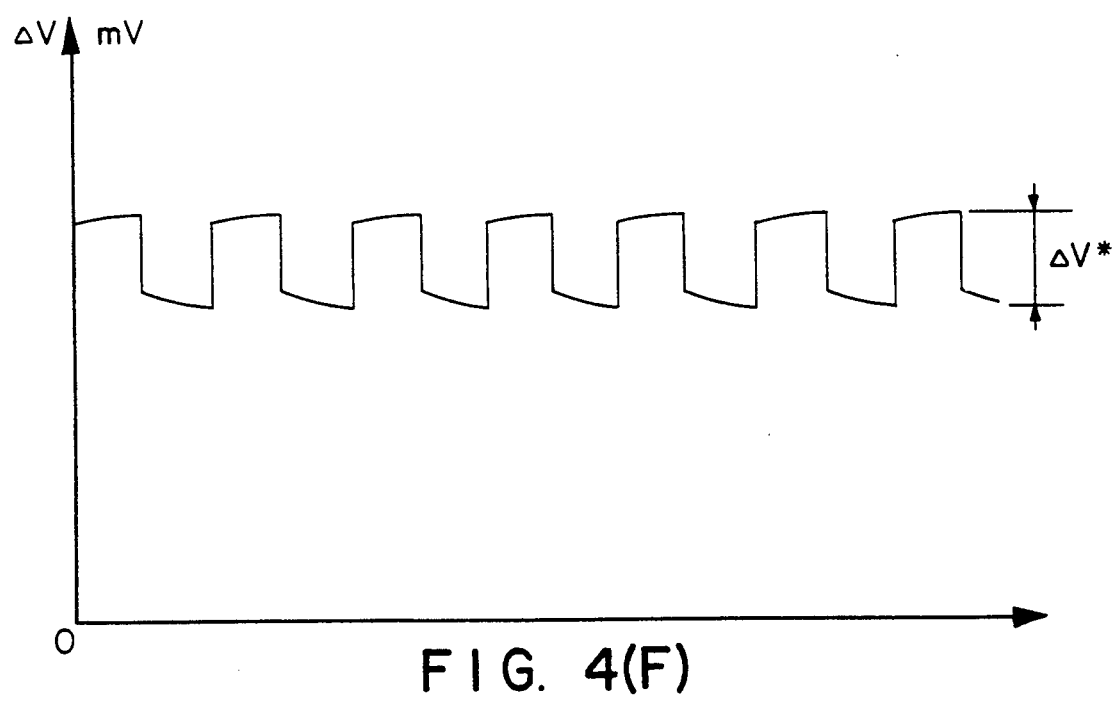

The insulation resistance (R) of the covering 3 is determined according to the invention by measuring the variation in potential due to the ohmic drop ($\Delta V^*$), in accordance with diagram F of FIG. 4 and measured by the voltmeter V, corresponding to the applied modulation current ($I^*$), where $I^*$ is the difference between the currents $I_{max}$ and $I_{min}$.

$$R = \Delta V^*/I^*$$

This enable both the insulation resistance R of the pipeline covering to be measured and its soundness to be determined. Knowing the value of R, the effective protection potential ($V_p$) can be calculated knowing its apparent global potential ($V_a$) and the total cathodic protection current (I), from the formula:

$$V_p = V_a - RI$$

The separation becomes possible with a square wave modulation only. The slope of the oblique portion in the hollow of the induced potential wave (diagram F of FIG. 4) can be directly correlated to the reactive capacitance between the conduit and the ground. Such a slope is indicative to the end of localizing the defects which are unevenly distributed throughout the conduit length. This slope reaches a maximum for the defects which are the farthest from the reference electrode. Therefore, not merely the value of $\Delta V^*$ is the solution of the problem, but also the shape of the plot, as it gives complementary responses.

The method according to the invention has been tested experimentally both in the laboratory and in the field to check its reliability, its versatility and its accuracy.

EXAMPLE 1

An 8" diameter steel pipe of length 100 cm and covered by diecasting with a 2 mm thickness of polyethylene filled with carbon black was immersed in mains water having a conductivity of 100 microS/cm at ambient temperature.

The measurement of the insulation resistance was conducted by effecting an intensity modulation of about 1.8% at a frequency of 0.08 Hz with a square wave half-period ratio of 3, the $I_{max}$ value being maintained for a time three times greater than that of the $I_{min}$ value.

The defects were simulated with steel plates having a known surface area short-circuited to the steel tube under test. The results obtained are shown in the following table.

TABLE 1

Insulation resistance as a function of the ratio of defect surface area to pipe surface area

| Mod | Defect area (cm$^2$) | I* (microA) | Defect/pipe area ratio | RI* (mV) | Insulation resistance (ohm · m$^2$) |
|---|---|---|---|---|---|
| 1.80 | 0.023 | 0.7 | 1/3.03 × 10$^5$ | 18.8 | 14622 |
| 1.95 | 0.070 | 1.6 | 1/0.97 × 10$^5$ | 18.8 | 8225 |
| 1.78 | 0.70 | 3.9 | 1/0.97 × 10$^4$ | 17.2 | 3087 |
| 1.84 | 7.0 | 13.0 | 1/0.97 × 10$^3$ | 39.2 | 1120 |

From the reported data it can be seen that even small defects are sufficient to determine a net reduction in the overall insulation resistance of the covering, and that the method of the invention enables this fall-off to be faithfully followed.

EXAMPLE 2

For the field test an existing bitumen-coated 12" diameter, 13 km long pipeline was used in which defects were simulated in the form of steel plates of known surface area short-circuited with the test pipeline, which was under cathodic protection.

In its coating, the pipeline also had pre-existing defects distributed randomly along its length.

The cathodic protection direct current generator was replaced by a square-wave modulated direct current generator, but using the pro-existing disperser and reference electrodes.

The insulation resistance of the pipeline was measured by operating with a 1.2% modulation depth at a frequency of 0.1 Hz, with a square wave half-period ratio of 3 as in the preceding case.

The following table shows the results of the measurements.

TABLE 2

Ohmic resistance of the covering of a real pipeline as a function of the ratio of defect surface area to pipe surface area

| Mod | Defect area (cm$^2$) | I* (mA) | Defect/pipe area ratio | RI* (mV) | Resistance specific (ohm · m$^2$) | Resistance overall (ohm) |
|---|---|---|---|---|---|---|
| 1.2 | 2370 | 2.4 | 1/4.5 × 10$^4$ | 8.52 | 37918 | 3.55 |

TABLE 2-continued

Ohmic resistance of the covering of a real pipeline as a function of the ratio of defect surface area to pipe surface area

| Mod | Defect area (cm$^2$) | I* (mA) | Defect/pipe area ratio | RI* (mV) | Resistance specific (ohm · m$^2$) | overall (ohm) |
|---|---|---|---|---|---|---|
| 1.2 | 2670 | 2.4 | 1/4.0 × 10$^4$ | 6.60 | 29373 | 2.75 |
| 1.2 | 2970 | 2.4 | 1/3.6 × 10$^4$ | 5.04 | 22430 | 2.10 |

NB:
(+) The surface area of the pipeline portion is 10681 m$^2$. The experimental tests conducted in the laboratory and in the field indicated the following.

The insulation resistance measurement can be conducted within a range of between 10$^{-3}$ ohm.m$^2$ and 10$^8$ ohm.m$^2$. The covering material can be of any type, the only condition being that it is not an electron conductor.

The sensitivity of the method is such that defects can be detected with a surface area ratio in the order of 1:10$^9$.

The obtainable data relates to the measurement of the pipeline insulation and the polarized potentials along the line.

The advantages of the method according to the invention are many, of which the following should be mentioned.

The method does not require interruption in the cathodic protection of the pipeline and can therefore be effected continuously. It also enables very accurate and reliable determinations to be made, as the serious disturbance due to electrochemical reactions which arise when the cathodic protection is interrupted or eliminated. The source of uncertainty due to the fact that current interruption is not instantaneous is also eliminated.

A further favorable aspect is that with the variation in the state of the covering with time, it is possible to vary the modulation level to allow the measurement accuracy to be substantially maintained.

This modulation variation must however be such that the value of $\Delta V_p$ is always maintained below the negative potential required for the cathodic potential.

The application of the present invention to existing pipelines requires only the current generator to be replaced by a modulatable current generator in existing installations, or the provision of a facility for modulating the direct current already produced by the existing generator.

The method is suitable for automation and for remote transmission of data to a collection center.

The device for implementing the present invention consists of the following units:
direct current power supply;
square wave generator;
square wave/direct current modulator;
measuring instruments which record the voltages induced by the current modulation; possibly together with:
processor for the recorded data;
remote transmission to the control center.

Figure 5:
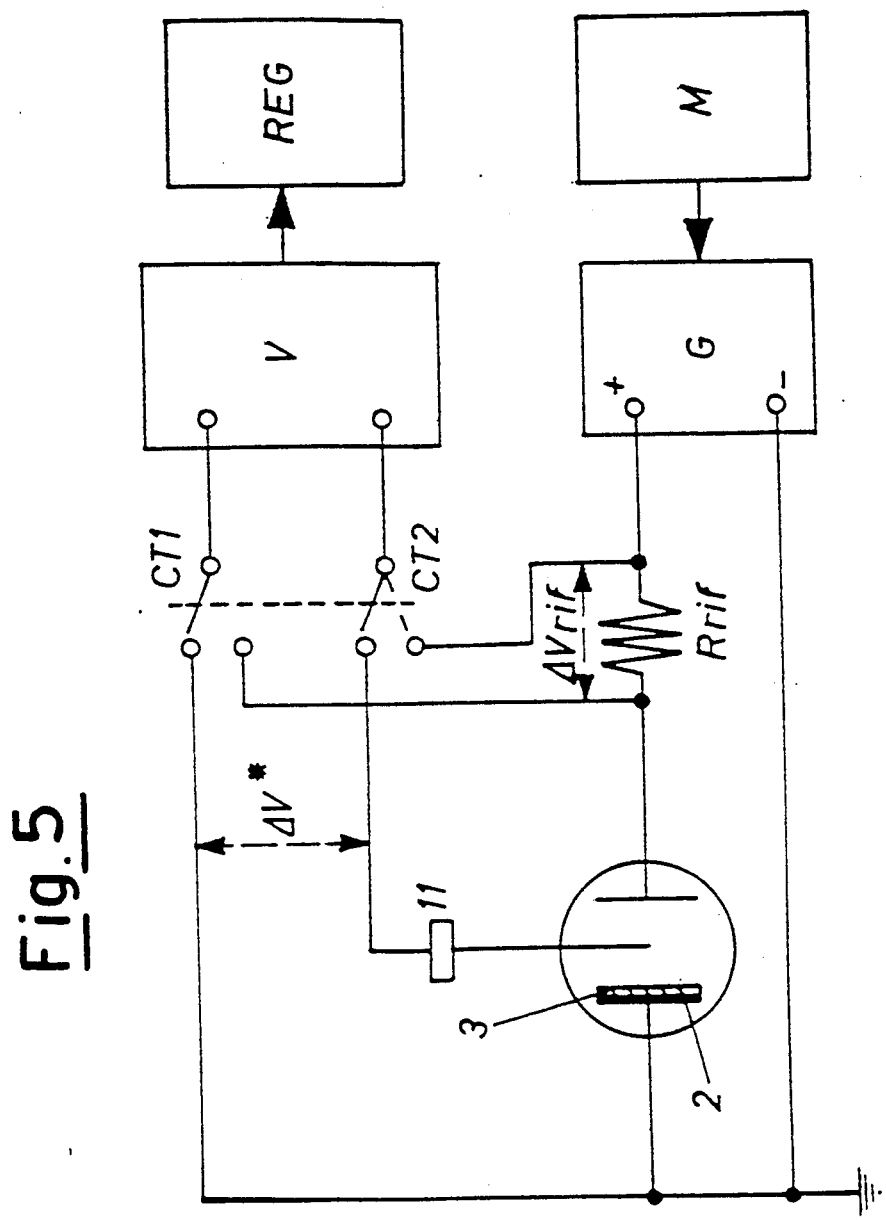

FIG. 5 shows a monitoring device according to the present invention by way of example.

The cathodic protection current is produced by the generator G, which is a mains-fed potentiostat providing a direct current at its terminals. The modulator M feeds the potentiostat with a modulation pulse which causes it to generate the two currents $I_{max}$ and $I_{min}$ at alternate times, so generating a square wave cathodic protection current.

The voltmeter V is an electrometer, ie a high-impedance voltmeter, which suffers no internal signal drop and thus provides a very accurate measurement.

In the circuit there is also connected between the negative pole of G and the pipeline 2 a known resistor $R_{rif}$ the purpose of which is to create an oscillating voltage drop proportional to the modulation, so making it possible to measure both I* and $\Delta V^*$ with the same electrometer V.

$\Delta V^*$ is measured directly, whereas I* is calculated from the relationship:

$$I^* = \Delta V_{rif}/R_{rif}$$

The purpose of the change-over switch CT1/CT2 is to enable the modulation current and the corresponding voltage variation to be read, these being measured across $R_{rif}$ and between the pipeline 2 and the reference electrode respectively.

The measurement made by the electrometer can be recorded either by a recorder on paper or by an oscilloscope.

We claim:

1. A method for continuously monitoring the soundness of a protective covering on an underground or immersed metal conduit subjected to cathodic protection, comprising:
   a. modulating the cathodic protection current applied to the conduit with substantially square waves, wherein said modulation is effected symmetrically at a level of modulation below 10%;
   b. directly measuring the potential variation due to the ohmic drop $\Delta V^*$ induced in the conduit by said applied modulation current I*; and
   c. determining the resistance offered by the covering by the relationship $R = \Delta V^*/I^*$, wherein the monitoring is effected continuously by permanently modulating the cathodic protection current imposed on the conduit and wherein the resistance is measured with the IR drop so that changes in the soundness of the protective covering of the conduit can be detected.

2. A method for continuously monitoring the soundness of the protective covering on a metal conduit as recited in claim 1, wherein the monitoring is effected continuously by permanently modulating the cathodic protection current imposed on the conduit.

3. A method for continuously monitoring the soundness of the protective covering on a metal conduit as recited in claim 2, wherein the current modulation is effected symmetrically at a level of modulation below 10%.

4. A method for continuously monitoring the soundness of the protective covering on a metal conduit as recited in claim 3, wherein the modulation frequency is less than 100 Hz and preferably between 0.05 Hz and 1 Hz, the ratio of the two half periods being between 0.001 and 1000 and preferably between 0.1 and 10.

5. A method for continuously monitoring the soundness of the protective covering on a metal conduit as recited in claim 4, wherein the measurement accuracy is maintained substantially constant with variations in the state of the covering with time by varying the level of modulation of the imposed cathodic protection current.

6. The method of claim 1, wherein said level of modulation is between 0.5% and 5%.

* * * * *